US007112962B2

(12) United States Patent
Ricks et al.

(10) Patent No.: US 7,112,962 B2
(45) Date of Patent: Sep. 26, 2006

(54) ANGULAR POSITION DETECTION UTILIZING A PLURALITY OF ROTARY CONFIGURED MAGNETIC SENSORS

(75) Inventors: Lamar F. Ricks, Freeport, IL (US); Michael J. Latoria, Rockford, IL (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/088,104

(22) Filed: Mar. 23, 2005

(65) Prior Publication Data

US 2006/0103373 A1 May 18, 2006

Related U.S. Application Data

(63) Continuation-in-part of application No. 10/993,964, filed on Nov. 18, 2004.

(51) Int. Cl.
*G01B 7/30* (2006.01)
*G01R 33/02* (2006.01)
*G01R 33/00* (2006.01)

(52) U.S. Cl. .................. 324/252; 324/207.25; 324/249

(58) Field of Classification Search ........... 324/207.25, 324/249, 252
See application file for complete search history.

(56) References Cited

U.S. PATENT DOCUMENTS

| 5,589,769 | A | 12/1996 | Krahn .................... 324/207.26 |
| 6,097,183 | A | 8/2000 | Goetz et al. ........... 324/207.12 |
| 6,509,732 | B1 | 1/2003 | Rhodes et al. ......... 324/207.12 |
| 6,731,108 | B1 | 5/2004 | Zalunardo et al. ....... 324/207.2 |
| 6,757,635 | B1 | 6/2004 | Topmiller .................... 702/150 |
| 6,806,702 | B1 | 10/2004 | Lamb et al. ........... 324/207.25 |
| 6,920,684 | B1 * | 7/2005 | Shonai et al. ............ 29/603.09 |
| 2002/0006017 | A1 * | 1/2002 | Adelerhof .................... 360/315 |
| 2002/0093332 | A1 * | 7/2002 | Schroeder et al. .......... 324/251 |
| 2004/0017187 | A1 * | 1/2004 | Van Ostrand et al. .. 324/207.21 |
| 2004/0070390 | A1 * | 4/2004 | Lamb et al. ........... 324/207.21 |

* cited by examiner

*Primary Examiner*—Bot LeDynh
(74) *Attorney, Agent, or Firm*—Kermit D. Lopez; Luis M. Ortiz

(57) ABSTRACT

A magnetic sensing method and system include a die comprising a central location thereof. A group of magnetoresistive bridge circuits are located and configured upon the die. A magnetic biasing component is then utilized to bias the plurality of magnetoresistive bridge circuits with a magnetic field rotating about an axis of the central location of the die in order to generate a plurality of bridge output signals thereof. Finally, the plurality of bridge output signals are processed in order to determine position data thereof.

19 Claims, 15 Drawing Sheets

ANGULAR POSITION DETECTION UTILIZING A PLURALITY OF ROTARY CONFIGURED MAGNETIC SENSORS

CROSS-REFERENCE TO RELATED APPLICATION

This patent application is a continuation-in-part of U.S. patent application Ser. No. 10/993,964, entitled "Position Detection Apparatus and Method for Linear and Rotary Sensing Applications," which was filed with the U.S. Patent & Trademark Office on Nov. 18, 2004, the disclosure of which is incorporated herein by reference in its entirety.

TECHNICAL FIELD

Embodiments generally relate to sensing devices. Embodiments are also related to magnetic sensing configurations based upon Hall-effect and/or magnetoresistive components. Embodiments are additionally related to angular and rotary position sensors.

BACKGROUND OF THE INVENTION

Various sensors are known in the magnetic-effect sensing arts. Examples of common magnetic-effect sensors include Hall-effect and magnetoresistive technologies. Such magnetic sensors can generally respond to a change in the magnetic field as influenced by the presence or absence of a ferromagnetic target object of a designed shape passing by the sensory field of the magnetic-effect sensor. The sensor can then provide an electrical output, which can be further modified as necessary by subsequent electronics to yield sensing and control information. The subsequent electronics may be located either onboard or outboard of the sensor package.

Hall-effect sensing devices represent one type of magnetic-effect sensors that are utilized widely in rotational and angular position detection. Hall-effect sensors incorporate Hall-effect elements that rely on a reaction between a current flowing between a first set of contacts and an orthogonally-applied magnetic field to generate a voltage across a second set of contacts. In theory, with no magnetic field applied to the Hall-effect element, no voltage should be generated across the second set of contacts. In practice, a voltage is typically generated across the second set of contacts even with no magnetic field applied to the Hall-effect element.

Magnetoresistive (MR) technology is also utilized in a variety of commercial, consumer and industrial detection applications. One type of MR technology is anisotropic magnetoresistive (AMR) technology. In some conventional MR systems an apparatus can be provided for determining the position of a member movable along a path. In such a device, a magnet can be attached to the movable member and an array of magnetic field transducers are located adjacent the path. This type of sensing configuration is commonly referred to as "MR Array" technology. As the magnet approaches, passes and moves away from a transducer, the transducer provides a varying output signal, which can be represented by a single characteristic curve that is representative of any of the transducers.

To determine the position of the movable member, the transducers are electronically scanned and data is selected from a group of transducers having an output that indicates relative proximity to the magnet. A curve-fitting algorithm can then be utilized to determine a best fit of the data to the characteristic curve. By placement of the characteristic curve along a position axis, the position of the magnet and therefore the movable member may be determined.

In another conventional MR device, a position determining apparatus can be implemented, which includes a magnet that is attached to a movable member that moves along a predefined path of finite length. An array of magnetic field transducers can be located adjacent to the predefined path. The transducers can provide an output signal as the magnet approaches passes and moves away from each transducer. A correction mechanism can also be implemented to correct for residual error caused by the non-linearity of the transducers.

Such a correction mechanism preferably approximates the residual error with a predetermined function, and applies correction factors that correspond to the predetermined function to offset the residual error. By correcting for the non-linearity of the transducers, the length of the magnet may be reduced and/or the spacing of the transducers may be reduced.

An example of a conventional magnetic sensing approach is disclosed, for example, in U.S. Pat. No. 5,589,769, "Position Detection Apparatus Including a Circuit for Receiving a Plurality of Output Signal Values and Fitting the Output Signal Values to a Curve," which issued to Donald R. Krahn on Dec. 31, 1996, and is assigned to Honeywell International Inc. Another example of another conventional magnetic sensing approach is disclosed in U.S. Pat. No. 6,097,183, "Position Detection Apparatus with Correction for Non-Linear Sensor Regions," which issued to Goetz et al. on Aug. 1, 2000 and is also assigned to Honeywell International Inc. A further example of a conventional magnetic sensing system is disclosed in U.S. Pat. No. 6,806,702, "Magnetic Angular Position Sensor Apparatus," which issued to Wayne A. Lamb et al on Oct. 19, 2004, and which is assigned to Honeywell International Inc. U.S. Pat. Nos. 5,589,769, 6,097,183 and 6,806,702 are incorporated herein by reference. Such conventional MR-based devices generally utilize discrete components on a Printed Circuit Board (PCB) assembly to yield the resulting function.

Because such conventional MR-based sensing devices, and in particular angle sensors, are required to be implemented in the context of small package diameters, such devices are not feasible in situations where there is not enough room for a bias magnet to be positioned in a "fly by mode". A magnetic circuit and sensor combination must therefore be implemented, which occupies less space.

Some systems utilize AMR bridges in association with simple mathematical functions such as ATAN (Inverse Tangent function) to determine absolute position data. One of the problems with utilizing mathematical functions such as ATAN is that in order to achieve high accuracy with this method, the AMR bridge signals must be as close to perfect sinusoids (i.e., Sin 2x and Cos 2x) as possible. To date, such goals have not been sufficiently achieved.

In order to overcome such problems, a new angular/rotary position sensing scheme and algorithm thereof must be designed in order to achieve maximum performance benefits. It is believed that the embodiments disclosed herein address and satisfy these issues.

BRIEF SUMMARY

The following summary is provided to facilitate an understanding of some of the innovative features unique to the present invention and is not intended to be a full description. A full appreciation of the various aspects of the embodiments can be gained by taking the entire specification, claims, drawings, and abstract as a whole.

It is, therefore, one aspect of the present invention to provide for an improved magnetic sensing configuration based upon Hall-effect and/or magnetoresistive components.

It is another aspect of the present invention to provide for an angular and rotary position sensor.

It is a further aspect of the present invention to provide for angular position detection systems and methods utilizing a plurality of rotary configured magnetic sensors.

The aforementioned aspects of the invention and other objectives and advantages can now be achieved as described herein. Magnetic sensing methods and systems are disclosed. In general, a die can be provided comprising a central location thereof. A group of magnetoresistive bridge circuits are located and configured upon the die. A magnetic biasing component is then utilized to bias the plurality of magnetoresistive bridge circuits with a magnetic field rotating about an axis of the central location of the die in order to generate a plurality of bridge output signals thereof. Finally, the plurality of bridge output signals are processed in order to determine position data thereof.

Thus, two or more magnetoresistive bridge circuits can share a central location thereof. A magnetic biasing component can be positioned proximate to the two or more magnetoresistive bridge circuits, such that the magnetic biasing component is rotated about an axis thereof to generate a magnetic field on the two or more magnetoresistive bridge circuits, and wherein the magnetic field is approximately close to a magnetic vector rotating about the central location in order to provide angular and rotational data thereof.

The magnetic biasing component and the magnetoresistive bridge components are separated from one another by a gap formed between the magnetic biasing component and the magnetoresistive bridge components. The magnetoresistive bridge circuits can generally include a plurality of AMR and/or Hall effect components. The magnetoresistive bridge circuits can be configured in the context of a four bridge 45° rotary AMR array configuration, which is described in greater detail herein. Additionally, the magnetic biasing component can be rotated about the axis thereof at a rotation angle that is selected from at least one angle of an angular range between 0° and 180°.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description of the invention, serve to explain the principles of the present invention.

DETAILED DESCRIPTION OF THE INVENTION

The particular values and configurations discussed in these non-limiting examples can be varied and are cited merely to illustrate one or more embodiments and are not intended to limit the scope thereof.

Figure 1:
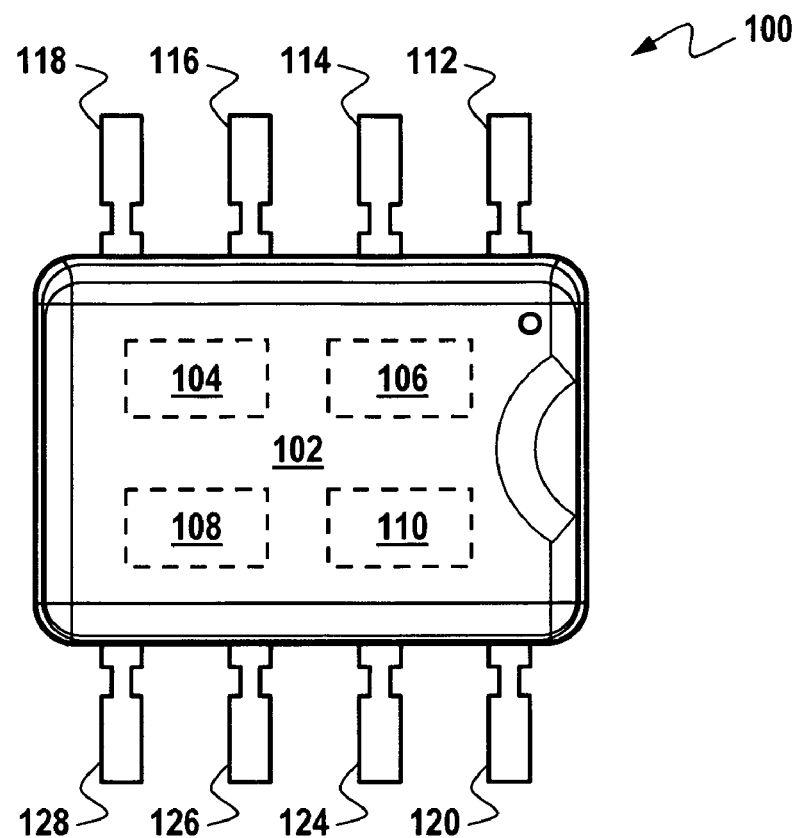
FIG. 1 illustrates a representative microelectronic package that would house a magnetic sensing component, which can be adapted for use in accordance with one embodiment.

FIG. 1 illustrates a representative microelectronic package that would house a magnetic sensing component 100, which can be adapted for use in accordance with one embodiment. Magnetic sensing component 100 can be implemented as an AMR bridge circuit and/or an amplifying ASIC device. Note that as utilized herein, the term "bridge circuit" and "bridge" can be utilized interchangeably to refer to the same device or component.

When implemented as an AMR bridge circuit, magnetic sensing component 100 can be configured to contain 2 co-located AMR bridge circuits rotated 45 degrees from one another to provide sine and cosine signals thereof. Magnetic sensing component 100 can be alternatively implemented to contain dual linear instrumentation amplifiers that provide signal conditioning for the aforementioned AMR bridge circuits or another type of transducer, thereby providing sine and cosine signals thereof from which data can be extracted for rotary and/or angular detection.

Magnetic sensing component 100 includes a plurality of electrical connections thereof in the form of pins 112, 114, 116, 118, 120, 124, 126 and 128. An integrated circuit is housed within sensing component 100 and may contain the AMR sensing elements we well as any associated amplifying components. Magnetic sensing component 100 can therefore be utilized for angular and/or rotary position sensing.

Figure 2:
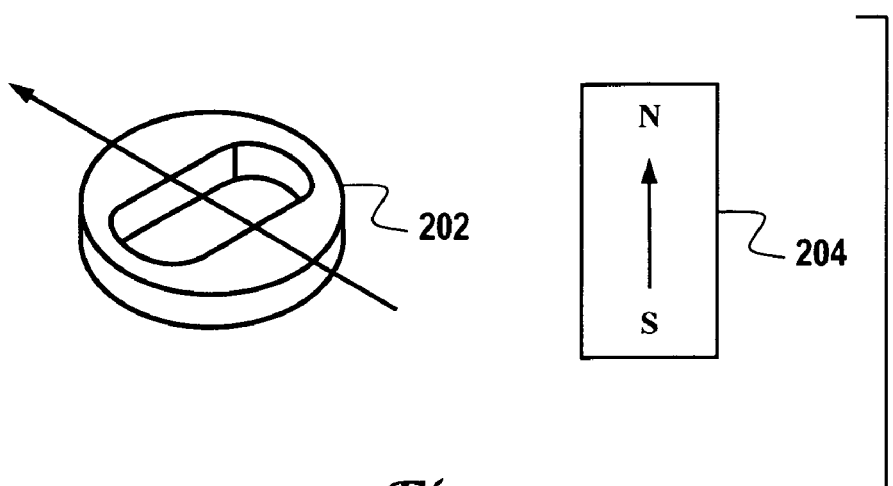
FIG. 2 illustrates rectangular and ring magnets, which can be adapted for use in accordance with one or more embodiments.

FIG. 2 illustrates respective rectangular and ring magnets 204 and 202, which can be adapted for use in accordance with one or more embodiments. The use of ring magnet 202 provides very low sensitivity to positional tolerance magnets and AMR bridge circuits. Rectangular magnet 204, on the other hand, when designed with physical dimensions providing for a cost effective solution may yield higher sensitivity to positional tolerances between magnet and AMR bridges. Ring magnet 202 can be formed from a material, such as, for example, compression molded NdFeB. Rectangular magnet 204 can be formed from a material, such as, for example, sintered NdFeB. Although ring magnet 202 and rectangular magnet 404 are discussed in accordance with some possible embodiments, it can be appreciated that other dipole magnet designs can be optimized to meet packaging requirements, depending upon the particular embodiment.

Figure 3:
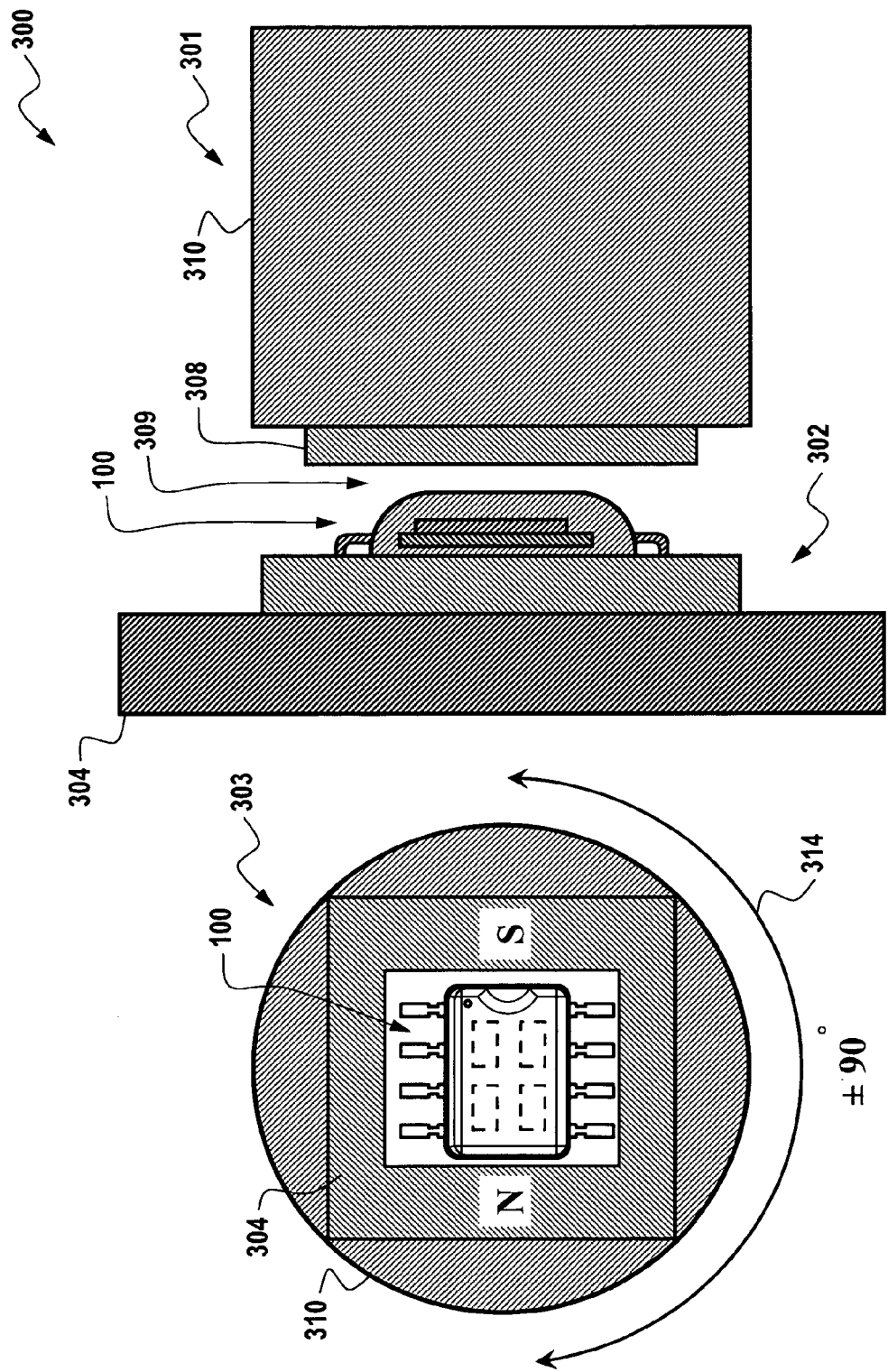
FIG. 3 illustrates a biasing system, which can be implemented in accordance with an embodiment.

FIG. 3 illustrates a biasing system 300, which can be implemented in accordance with an embodiment. Note that a side view 301 of system 300 is depicted in FIG. 3, along with a top view 303 thereof. Note that in views 301 and 303, identical or similar parts are generally indicated by identical reference numerals. System 300 includes a shaft 310, which can be formed from a ferrous or non-ferrous material. Shaft 310 is located adjacent to biasing magnet 308. A gap 309 is formed between magnet 308 and magnetic sensing component 100, which was disclosed in greater detail in FIG. 1.

Magnet 308 can be implemented as, for example, rectangular and ring magnets 204 and 202 respectively depicted in FIG. 2, or any combination of magnets and pole pieces that would produce a uniform magnetic bias field on magnetic sensing component 100. Magnetic sensing component can be located on a printed circuit board (PCB) 302, which is connected to a non-ferrous base such as aluminum, thermoplastic, etc. 304. Note that in view 303, arrow 314 indicates a positive or negative 90° rotation of shaft 310. System 300 therefore represents one possible biasing configuration.

Figure 4:
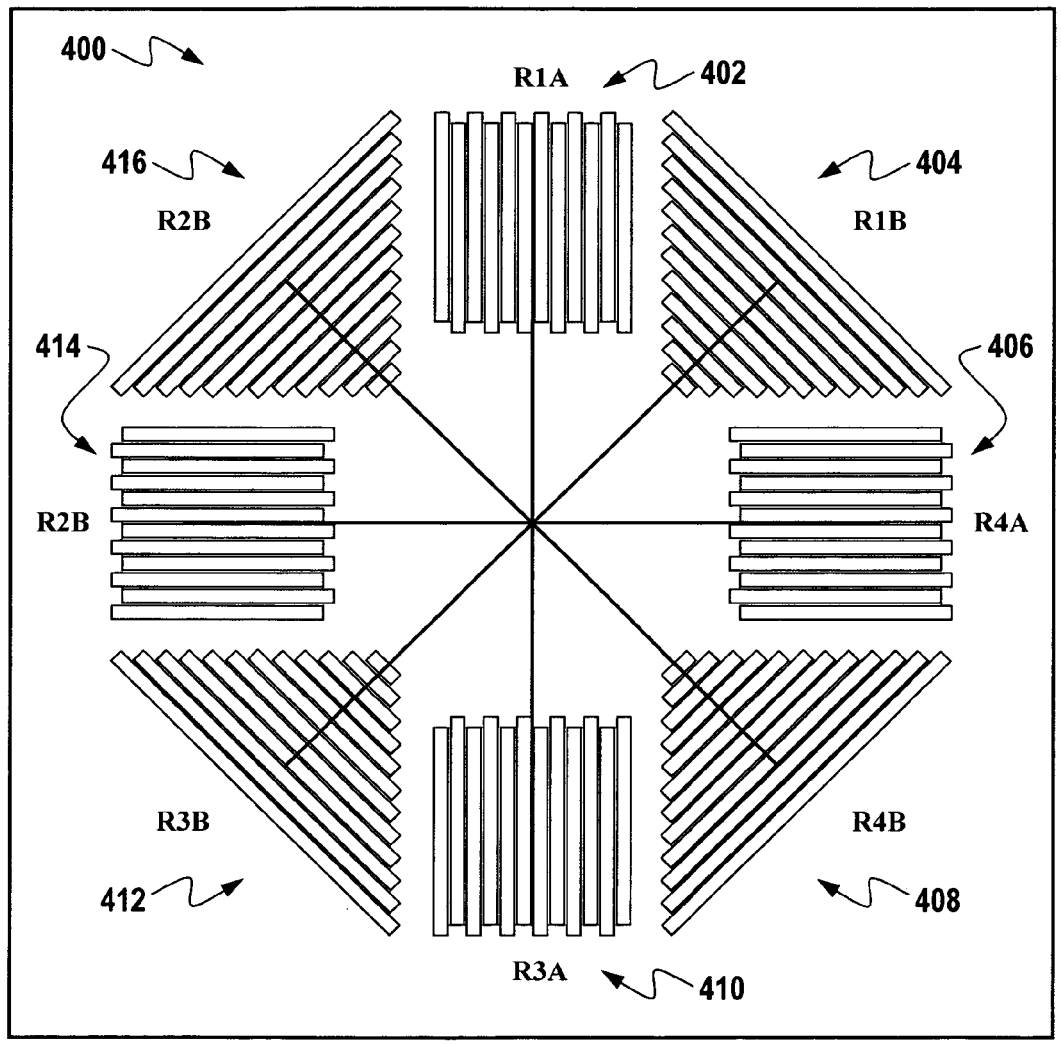
FIG. 4 depicts a schematic diagram of a two-magnetoresistive sensing bridge circuit, which can be implemented in accordance with one possible embodiment.

FIG. 4 depicts a physical layout of two co-located AMR bridges on one die, which can be implemented in accordance with one possible embodiment. FIG. 4 generally illustrates a layout of eight resistors arranged between two Wheatstone sensing bridges. It can be appreciated by those skilled in the art that the configuration depicted in FIG. 4 represents one of many possible magnetoresistive sensing designs that can be utilized in accordance with the invention described herein. Fewer or additional resistors and/or resistor patterns can be utilized, depending on a desired application.

In FIG. 4, a first bridge circuit can include rectangular shaped resistor patterns 402, 414, 410, and 406 (i.e., respectively labeled resistors R1A, R2A, R3A, and R4A), which can be electrically connected to form a single Wheatstone bridge. A second bridge circuit (i.e., Bridge B), whose resistors are oriented at 45 degree to those of Bridge A and triangular in their shape patterns, is configured from resistors 404, 416, 412, and 408 (i.e., respectively labeled resistors R1B, R2B, R3B, and R4B).

The four-axis symmetry of the eight-resistor layout pattern illustrated in FIG. 4 represents only one example of an arrangement of two sensing bridges. Other eight resistor patterns can be constructed, for example, having a less symmetrical or non-symmetrical arrangement but having all eight resistors with identical shape and size. At least two separate sensing bridges can thus share a common geometrical center point and can also be rotated from one another (i.e., in this case 45° although other angles are possible) to provide signals offset from one another.

Figure 5:
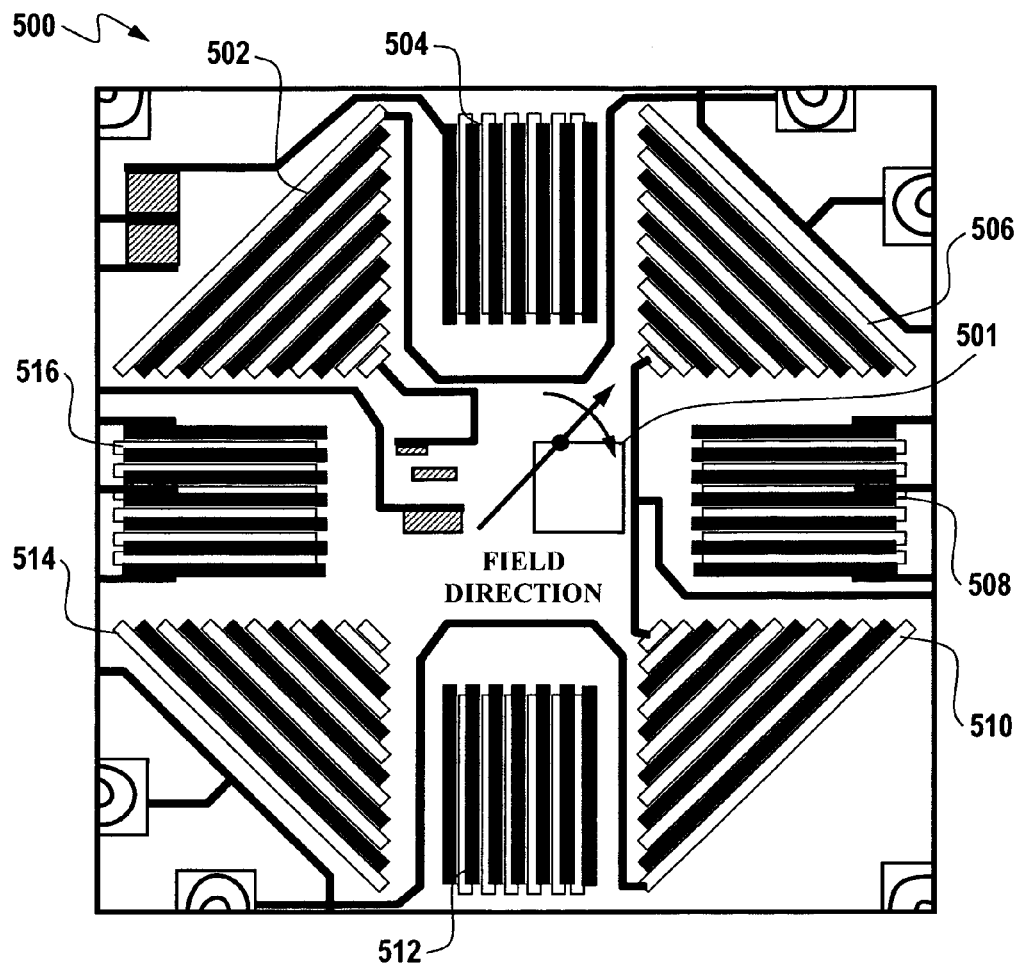
FIG. 5 illustrates an alternative view of an AMR bridge circuit, including a representative field direction thereof that can be implemented in accordance with an embodiment.

Note that FIG. 5 illustrates an AMR bridge circuit 500, which is analogous to the configuration depicted in FIG. 4. As indicated in FIG. 5, a representative field direction 501 that rotates through AMR bridges of circuit 500 when a magnet, such as magnet 308 rotates. AMR bridge circuit 500 is generally formed from two AMR bridge circuits composed of magnetoresistors 502, 504, 506, 508, 510, 512, 514, and 516.

Figure 6:
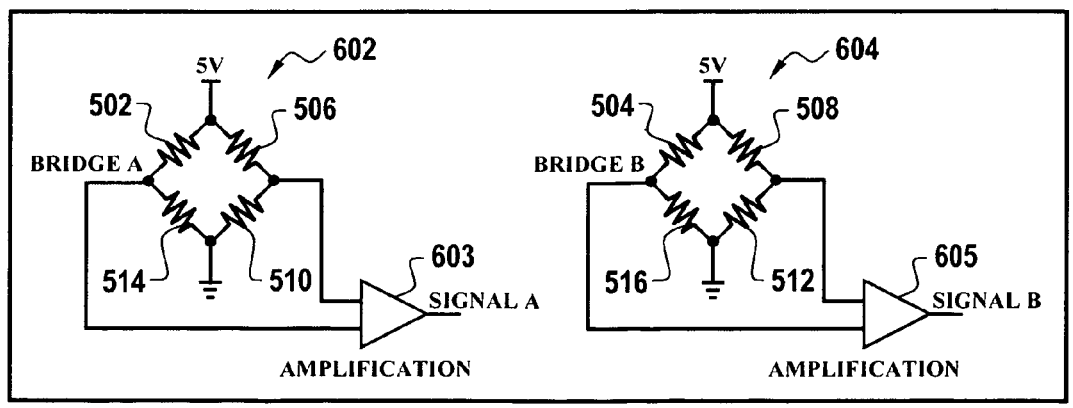
FIG. 6 illustrates an AMR sensing circuit with signal A and signal B amplification thereof, in accordance with an embodiment.

FIG. 6 illustrates a schematic diagram of an AMR sensing circuit 600 with signal A and signal B amplification thereof, in accordance with an embodiment. Note that circuit 600 depicted in FIG. 6 schematically represents the electrical schematic of circuit 500 depicted in FIG. 5. Thus, two bridge circuits 602 and 604 are depicted in FIG. 6, which form circuit 600. Bridge circuit 602 is therefore formed from a plurality of magnetoresistors 502, 506, 510, and 514, while bridge circuit 604 is formed from a plurality of magnetoresistors 504, 508, 512, and 516. Bridge circuit 602 is connected to an amplifier 603 in order to output a signal A, while bridge circuit 604 is connected to an amplifier 605 in order to output a signal B.

Figure 7:
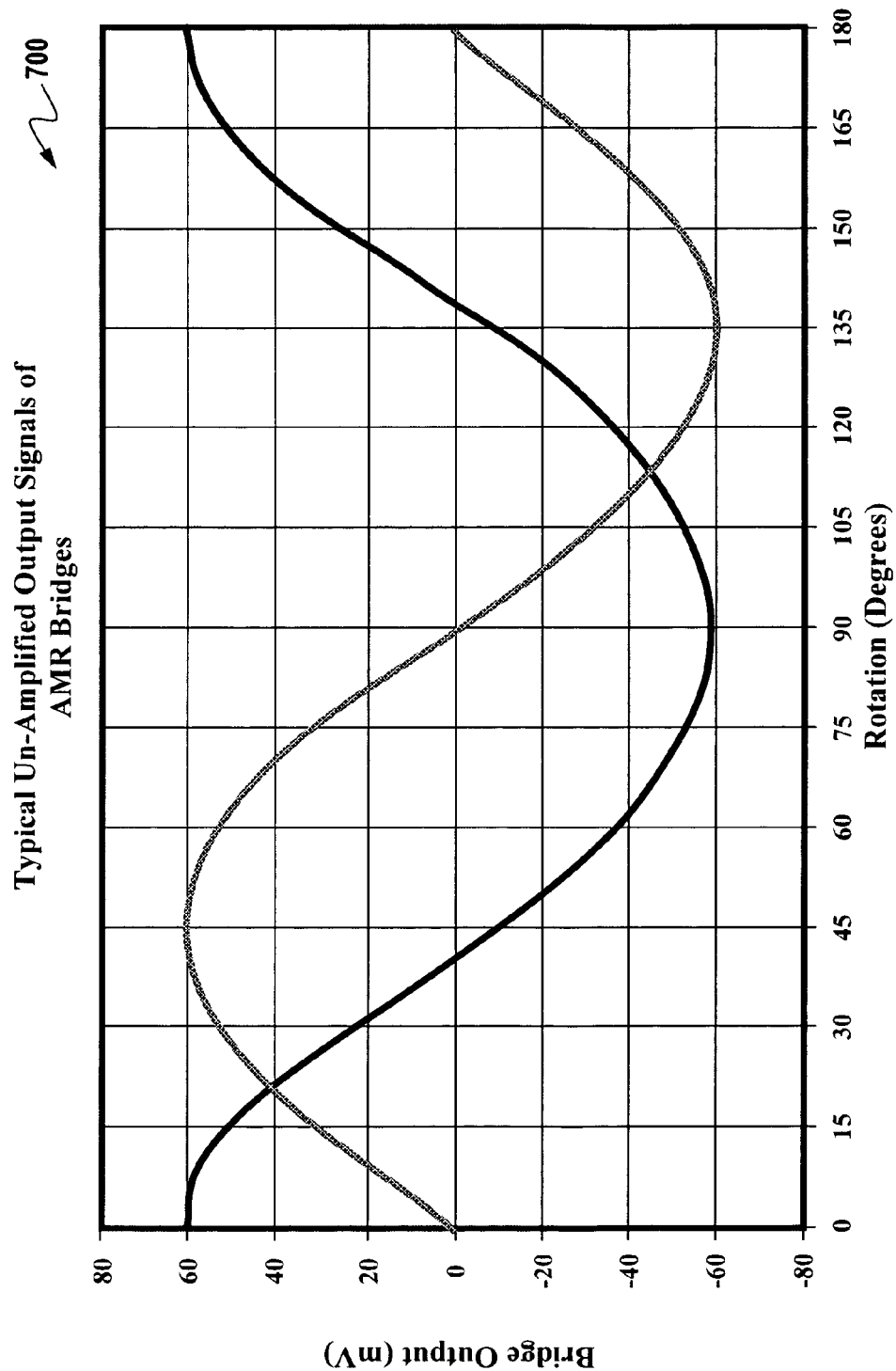
FIG. 7 illustrates a graph of un-amplified output signals of AMR bridge circuits for illustrative purposes.
Figure 8:
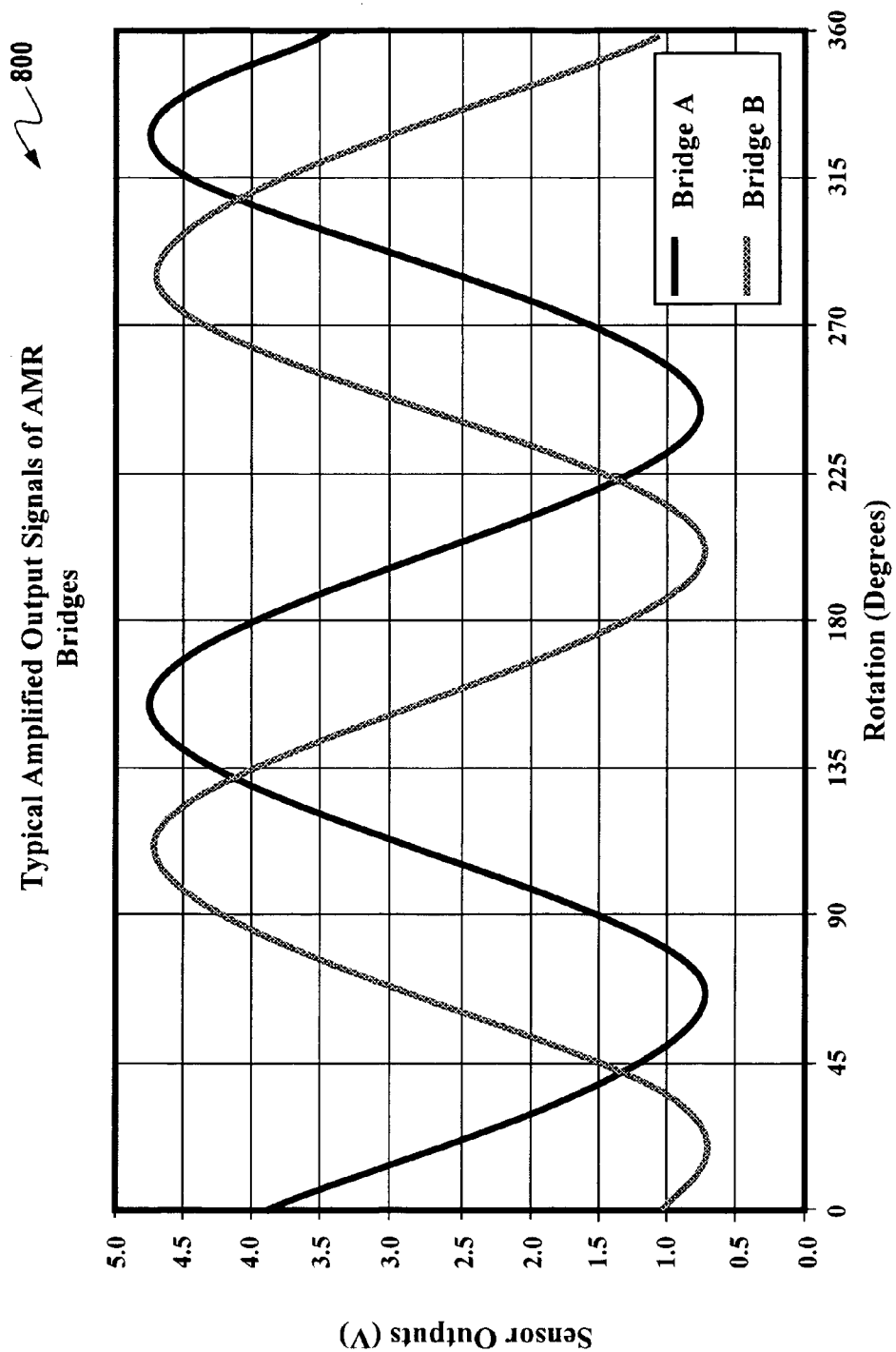
FIG. 8 illustrates a graph of typical amplified output signals for AMR bridge circuits in accordance with an embodiment.

FIG. 7 illustrates a graph 700 of un-amplified output signals of AMR bridge circuits, such as, AMR bridge circuits 602 and 604. Graph 700 generally indicates data calculated as a result of a bridge output versus rotation (in degrees). FIG. 8 illustrates a graph 800 of typical amplified output signals for AMR bridge circuits (e.g., bridge circuits 602, 604) in accordance with an embodiment. Notice that the signals from the AMR bridge repeat every 180 degrees, implying a SIN (2θ) function. A 360 degree sensing capability can be easily achieved by adding a digital Hall switch to differentiate between north and south poles of the bias magnet (e.g., magnet 308 of FIG. 3).

Note that a procedure can be implemented for processing sensor signals utilizing a microprocessor. In general, a magnetic sensing system, such as system 300 depicted in FIG. 3, can be calibrated at 25° C. by rotating the field and reading the sensor signals. During calibration the following are calculated:

Offset $A$=(Max signal $A$+Min signal $A$)/2

Offset $B$=(Max signal $B$+Min signal $B$)/2

Amp $A$=(Max signal $A$−Min signal $A$)/2

Amp $B$=(Max signal $B$−Min signal $B$)/2

$N$=Amp $A$/Amp $B$

During actual operation the signals are fed into the A/D pins of the microprocessor and the following formulas are used to determine position:

Signal $A$=Voltage $A$−Offset $A$

Signal $B$=Voltage $B$−Offset $B$

Angle=$ATAN$(Signal $A$/(Signal $B*N$))/2

The idea behind this approach is that all common mode effects fall out of the equation in a self compensating manner. For example, the bridge signals A & B will vary the same amount over temperature. When this happens the errors cancel out when Signal A and Signal B are divided.

Figure 9:
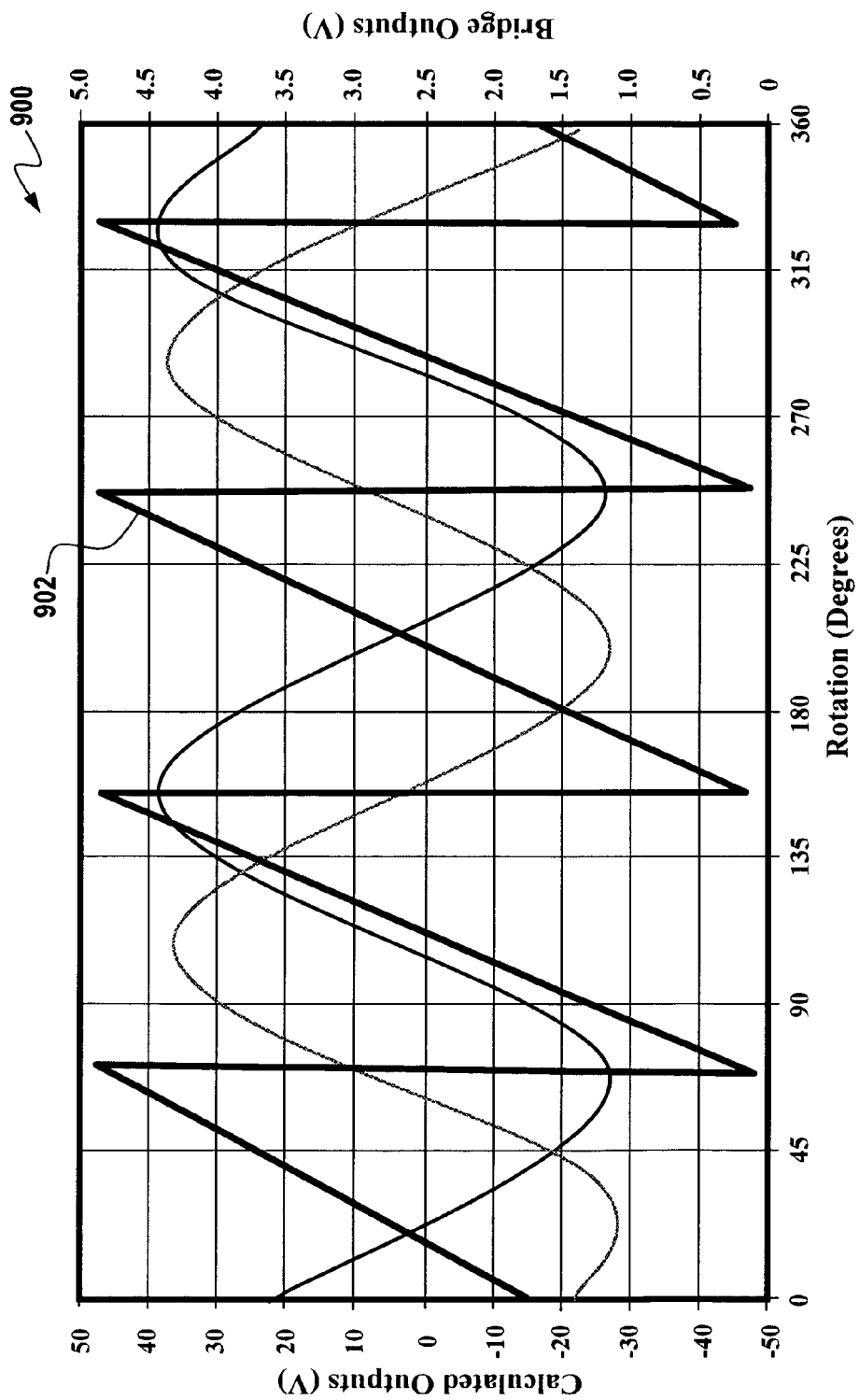
FIG. 9 illustrates a graph representing data generated as a result of a signal processing algorithm that can be implemented in accordance with an embodiment.

FIG. 9 therefore illustrates an example of a graph 900 representing data generated as a result of implementing a signal processing algorithm as indicated above, in accordance with one embodiment. Note that the "ATAN" resultant value can indicated in the equations above can be plotted via line 902 depicted in FIG. 9.

Figure 10:
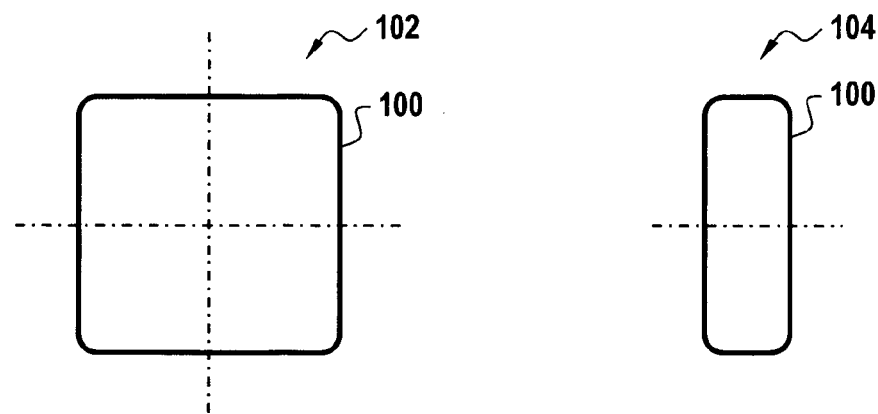
FIG. 10 illustrates a bias magnet configuration that can be implemented in accordance with an embodiment.
Figure 11:
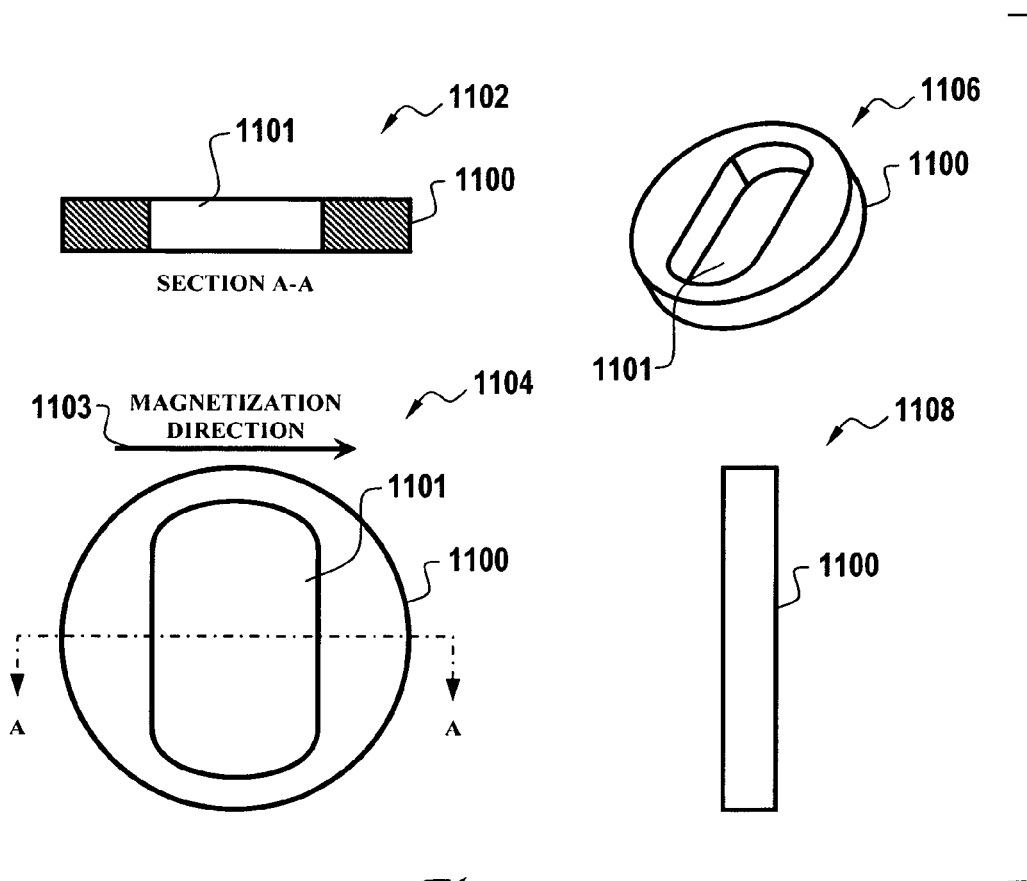
FIG. 11 illustrates a ring magnet configuration that can be implemented in accordance with an alternative embodiment.

FIG. 10 illustrates a bias magnet 100 configuration that can be implemented in accordance with one embodiment. In FIG. 10, two views are provided. A top view 102 of bias magnet 100 along with a side view 104 thereof. FIG. 11 illustrates a ring magnet 1100 configuration that can be implemented in accordance with an alternative embodiment. Note that in FIG. 11, four views of ring magnet 1100 are provided, including a sectional view 1102, along with a top view 1104, a perspective top view 1106 and a side view 1100. In general, ring magnet 1100 includes a central opening 1101. In view 1104, the magnetization direction 1103 is depicted. In general, view 1102 presents a sectional A—A view of ring magnet 1100. Note that ring magnet 1100 depicted in FIG. 10 is generally analogous to ring magnet 202 depicted in FIG. 2.

Figure 12:
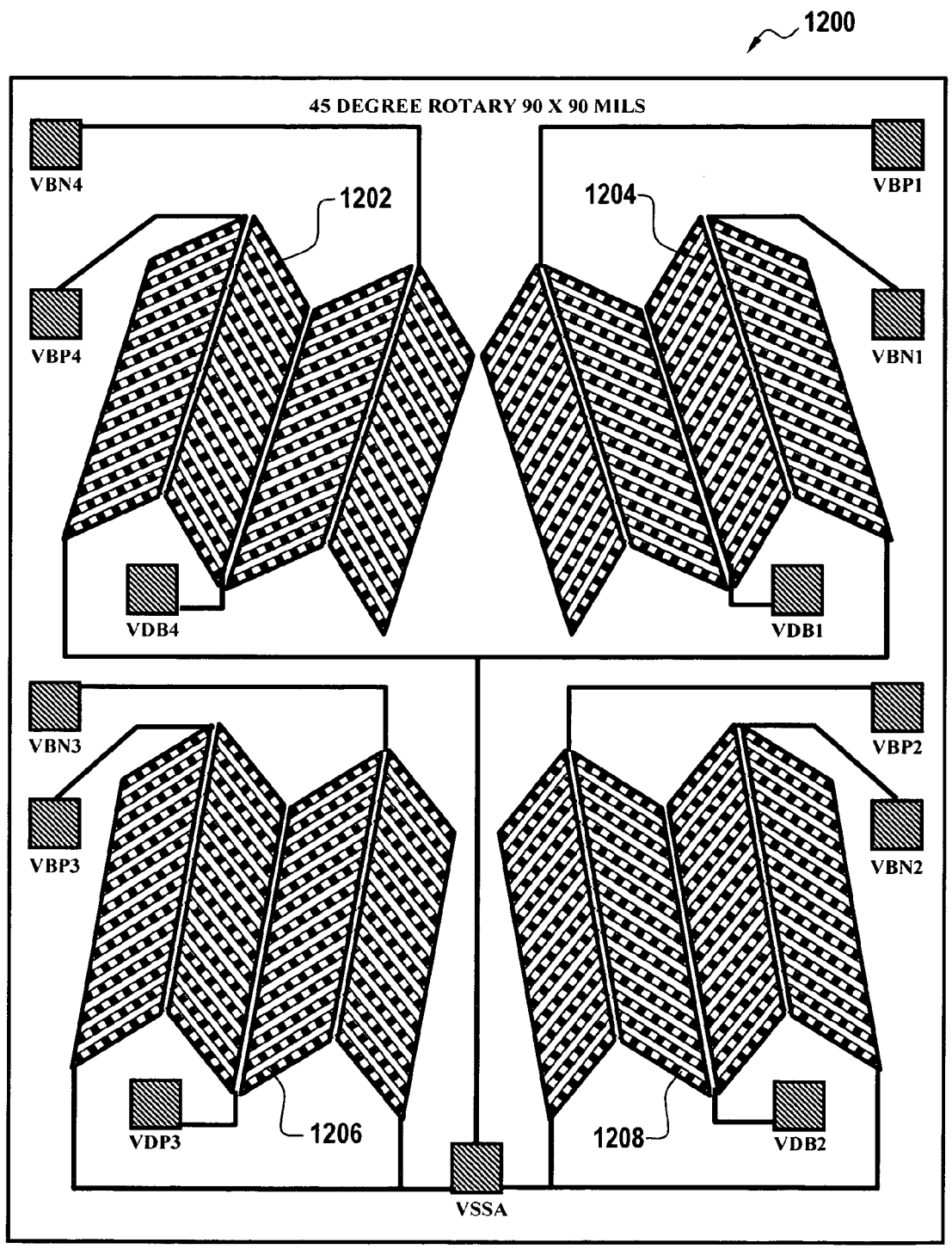
FIG. 12 illustrates a layout of a die for a 4-bridge 45 degree rotary AMR array system, in accordance with a preferred embodiment.

FIG. 12 illustrates a layout of a die for a 4-bridge 45° rotary AMR array system 1200, in accordance with a preferred embodiment. System 1200 is generally composed of 4 bridge circuits formed from Magnetoresistive elements electrically connected in a wheatstone bridge configuration, components 1202, 1204, 1206 and 1208. System 1200 thus can implement a rotary AMR sensing configuration in which the bias magnet or magnetic bias circuit is rotated about an axis and the magnetic field generated on the AMR bridge or bridge circuit is preferably as close to a magnetic vector rotating about the center, similar to the hands of a clock. Two or more AMR bridges can be implemented in the configuration of system 1200.

Figure 13:
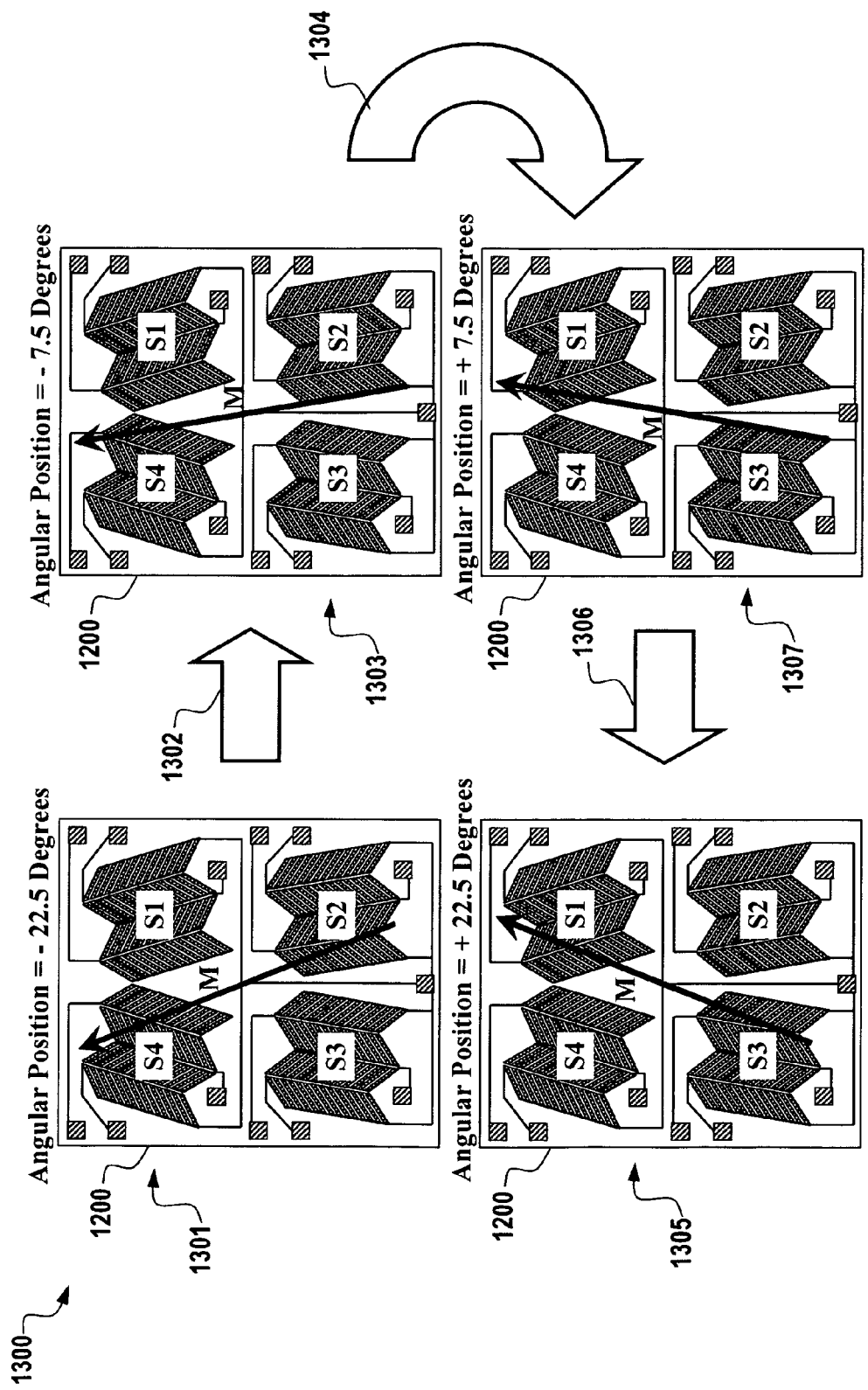
FIG. 13 illustrates a rotary AMR array system that can be implemented in accordance with a preferred embodiment.

FIG. 13 illustrates a rotary AMR array system 1300 that can be implemented in accordance with a preferred embodiment. Note that in FIGS. 12–13, identical or similar parts or components are generally indicated by identical reference numerals. Thus, system 1200 depicted in FIG. 12 can be utilized in association with system 1300. Rotation of system 1200 is generally indicated by positions 1301, 1303, 1307 and 1305. Initially, position 1301 indicates an angular position of −22.5 degrees followed by position 1303, which indicates an angular position of −7.5 degrees. Note that arrows 1302, 1304 and 1306 indicate the angular rotation of the resultant magnetic bias field or magnetic vector at various rotational positions. Position 1307 indicates an angular position of +7.5 degrees and position 1305 indicates an angular position of +22.5 degrees. The magnetic vector is represented in FIG. 13 by arrow M. As the bias magnet or magnetic circuit rotates in angle, the resulting field on the die appears to be a uniform vector rotating about similar to the hand on a clock.

Figure 14:
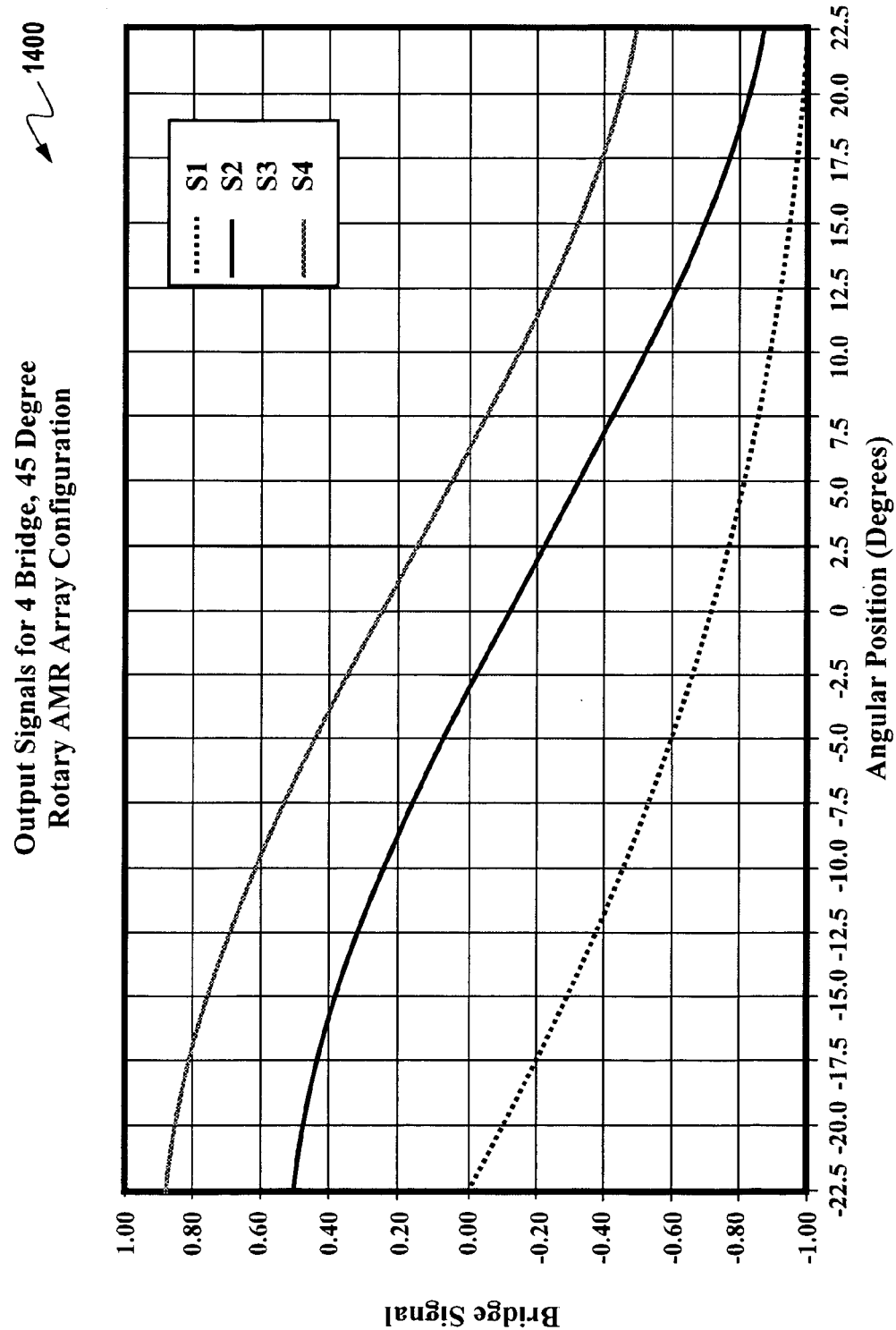
FIG. 14 illustrates a graph depicting output signals for a 4-bridge, 45 degree rotary AMR array configuration that can be implemented in accordance with one embodiment.

FIG. 14 illustrates a graph 1400 depicting differential bridge signals for a 4-bridge, 45 degree rotary AMR array configuration that can be implemented in accordance with one embodiment. Graph 1400 thus represents one possible set of data that can be collected as a result of the angular movement illustrated in FIG. 13. Graph 1400 is therefore associated with system 1300. Note that although the aforementioned examples describe a 4-bridge 45 degree sensor configuration, any number of bridges greater than or equal to 2 can be implemented in accordance with the embodiments. Additionally, any rotational angle between 0 and 180 degrees can be utilized for such a rotary AMR array sensing configuration. Note that the reason 180 degrees is considered the rotational angle limit for such a configuration is because permalloy (i.e., AMR) has a response proportional to SIN (2θ) and the output repeats every 180 degrees.

Figure 15:
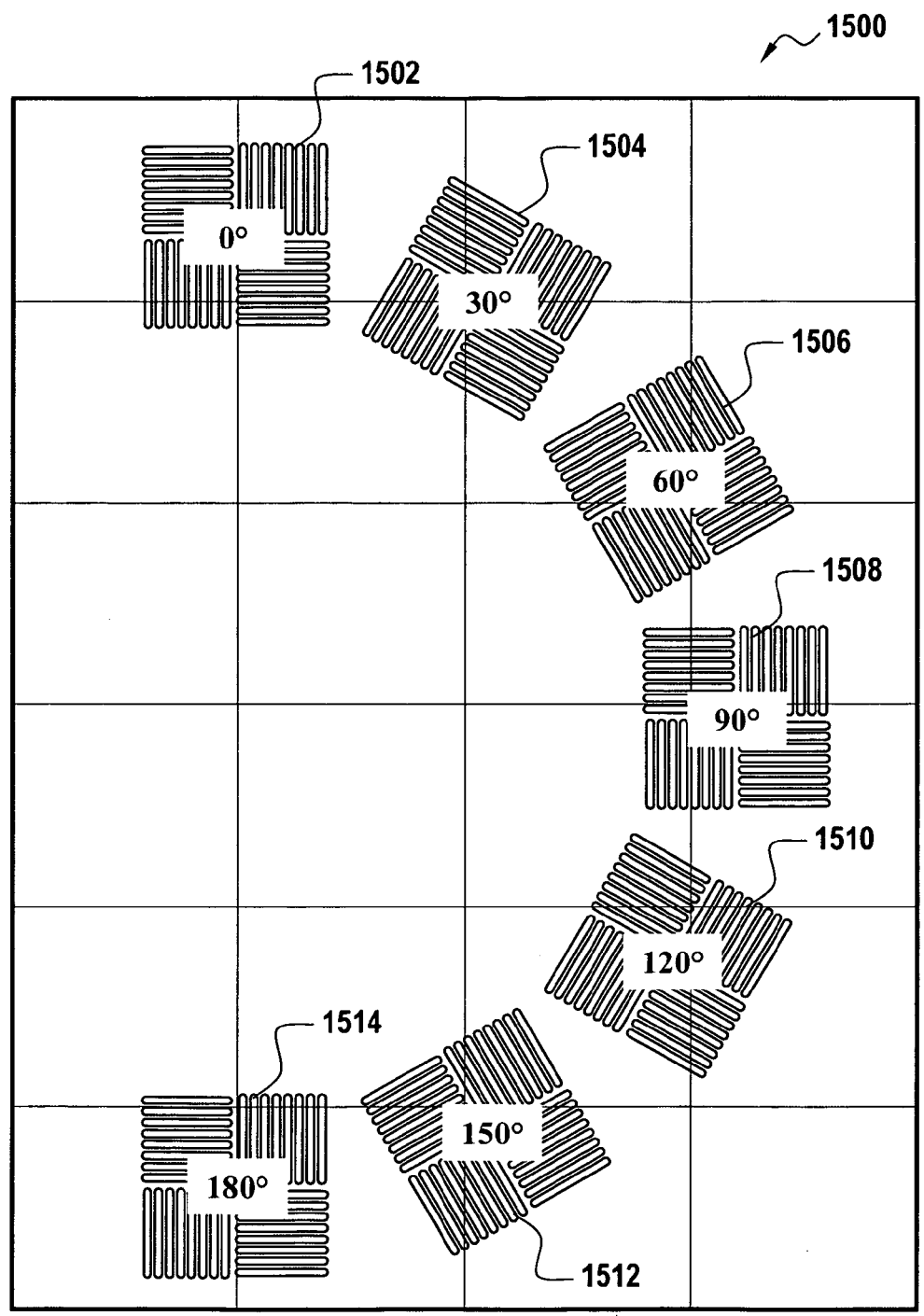
FIG. 15 illustrates a system of AMR bridge circuits arranged in a half-circular pattern in accordance with one embodiment.
Figure 16:
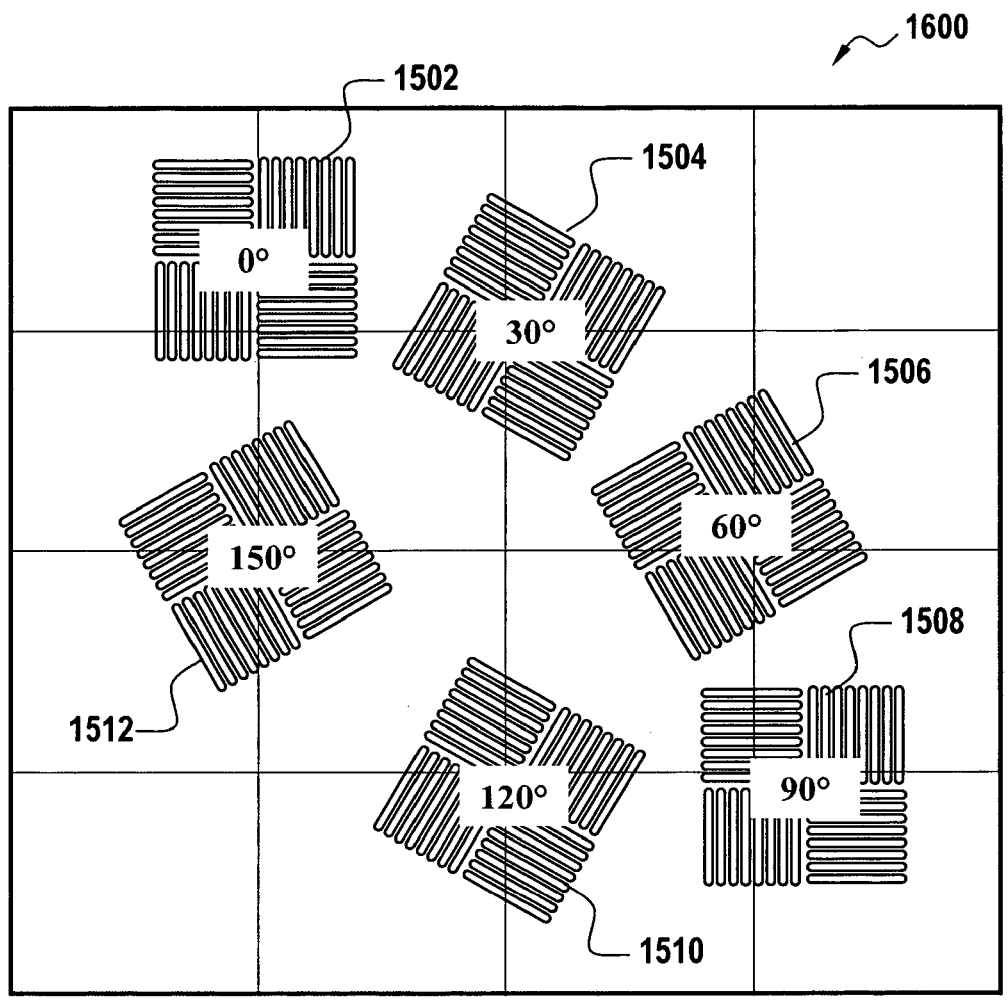
FIG. 16 illustrates a system of AMR bridge circuits arranged in an oval pattern in accordance with another embodiment.

FIG. 15 illustrates a system 1500 of AMR bridge circuits 1502, 1504, 1506, 1508, 1510, 1510, 1512, and 1514 arranged in a half-circular pattern in accordance with one embodiment. FIG. 16 illustrates a system 1600 of AMR bridge circuits 1502, 1504, 1506, 1508, 1510, 1510, 1512, and 1514 arranged in an oval pattern in accordance with another embodiment.

Figure 17:
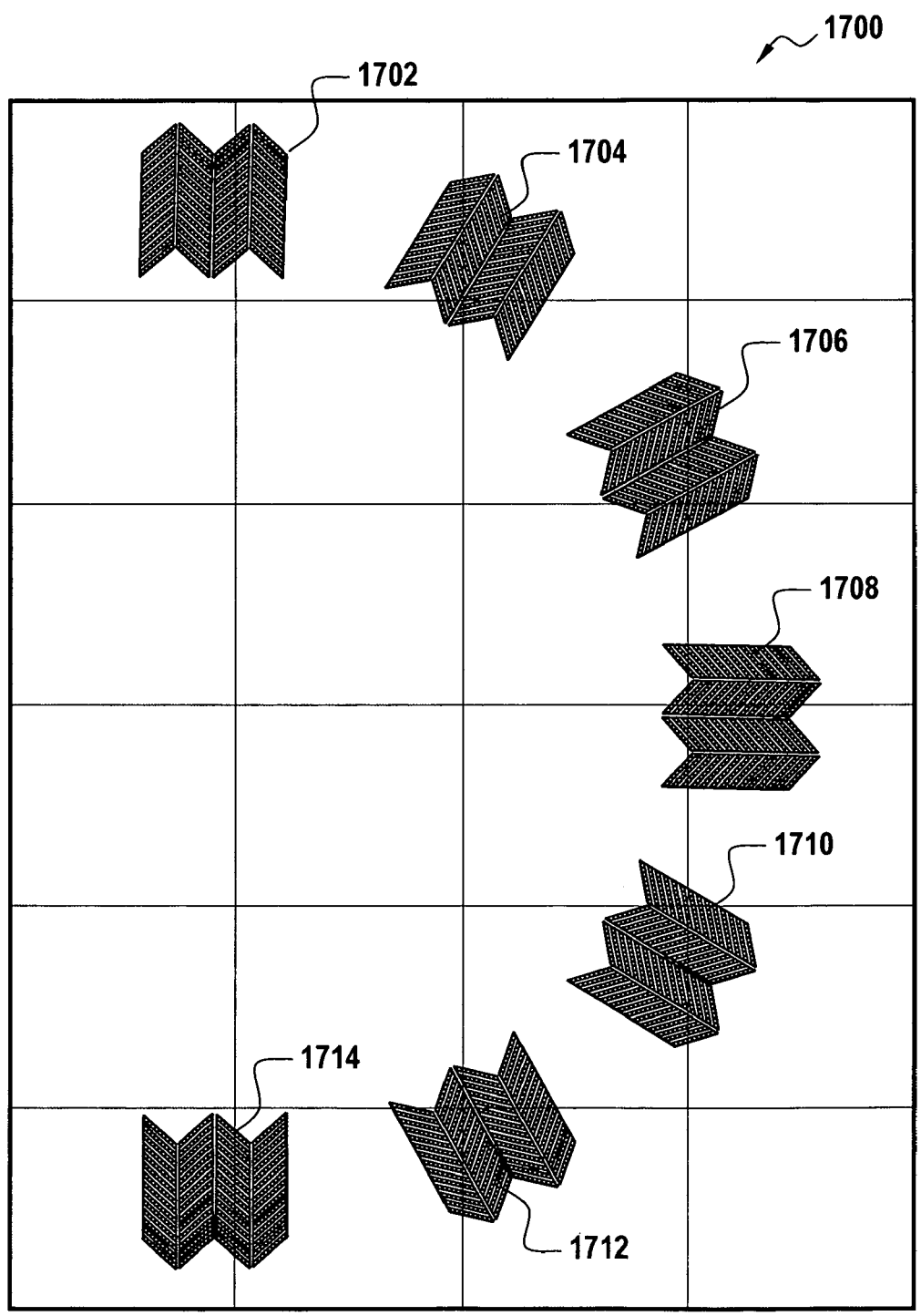
FIG. 17 illustrates a system of AMR bridge circuits arranged in a half-circular pattern in accordance with one embodiment.
Figure 18:
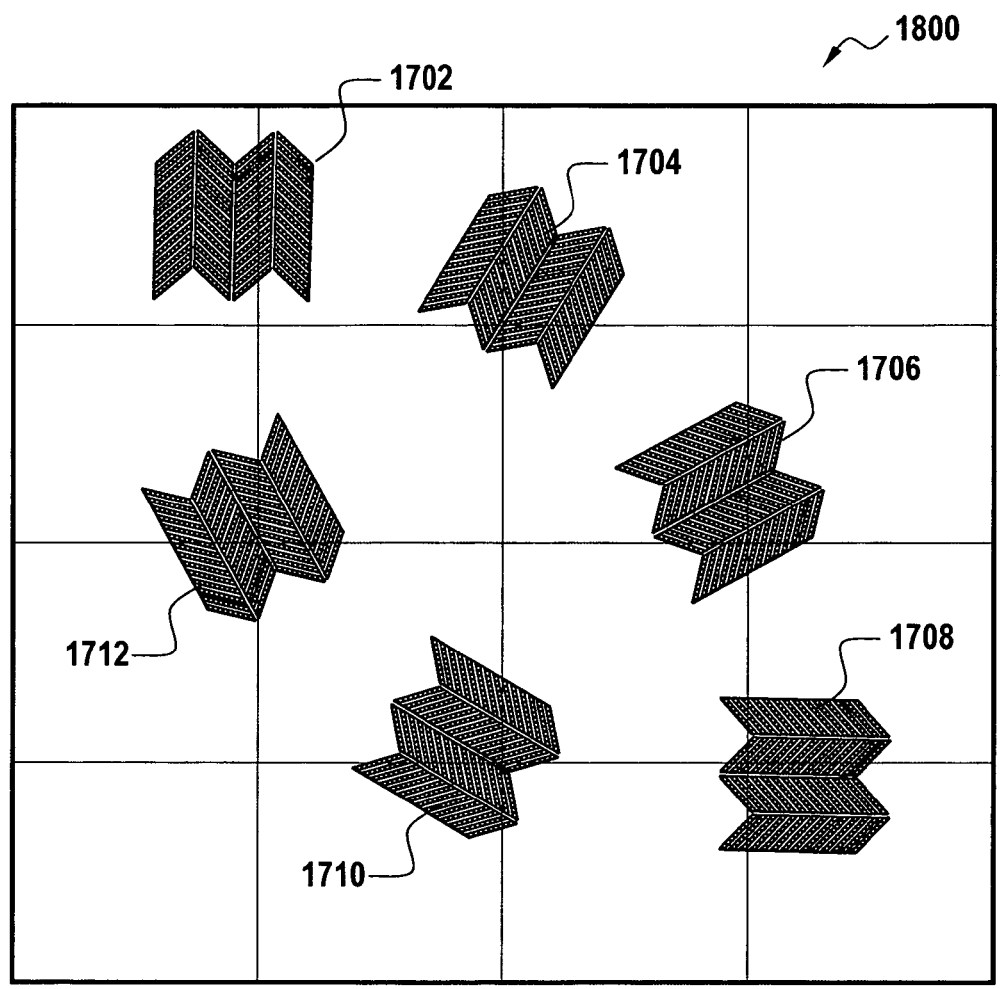
FIG. 18 illustrates a system of AMR bridge circuits arranged in an oval pattern in accordance with another embodiment.

FIG. 17 illustrates a system 1700 of AMR bridge circuits 1702, 1704, 1706, 1708, 1710, 1712, and 1714 arranged in a half-circular pattern in accordance with one embodiment. FIG. 18 illustrates a system 1800 of AMR bridge circuit 1702, 1704, 1706, 1708, 1710, 1712, and 1714 s arranged in an oval pattern in accordance with another embodiment.

Based on the foregoing, it can be appreciated that the embodiments described herein generally teach a method and/or system in which a die is provided with a central location thereof and a plurality of magnetoresistive bridge circuits are located and configured upon the die. A magnetic biasing component is then utilized to bias the magnetoresistive bridge circuits (i.e., transducers) with a magnetic field rotating about an axis of the central location of the die in order to generate a plurality of bridge output signals thereof. The bridge output signals can then be processed in order to determine position data thereof.

Note that various magnetoresistive array algorithms and methods can be utilized to process the bridge output signals. Such MR array algorithms and methods can be combined to process multiple signals with the multi-bridge transducer design biased with a magnetic field rotating about the axis of the center of the die, as indicated herein without limiting the scope and breadth of the embodiments. One example of an MR array algorithm and/or method that can be utilized to process the bridge output signals is disclosed in U.S. Pat. No. 5,589,769, "Position Detection Apparatus Including a Circuit for Receiving a Plurality of Output Signal Values and Fitting the Output Signal Values to a Curve," which issued to Donald R. Krahn on Dec. 31, 1996, and is assigned to Honeywell International Inc.

U.S. Pat. No. 5,589,769 is incorporated herein by reference and generally describes an apparatus for determining the position of a member movable along a path. In U.S. Pat. No. 5,589,769, a magnet is attached to the movable member and an array of magnetic field transducers are located adjacent the path. As the magnet approaches, passes and moves away from a transducer, the transducer provides a varying output signal which can be represented by a single characteristic curve that is representative of any of the transducers. To determine the position of the movable member, the transducers are electronically scanned and data is selected from a group of transducers having an output that indicates relative proximity to the magnet. A curve fitting algorithm is then used to determine a best fit of the data to the characteristic curve. By placement of the characteristic curve along a position axis, the position of the magnet and therefore the movable member may be determined.

Another example of an MR array algorithm and/or method that can be utilized to process bridge output signals is disclosed in U.S. Pat. No. 6,097,183, "Position Detection Apparatus with Correction for Non-Linear Sensor Regions," which issued to Goetz et al. on Aug. 1, 2000 and is also assigned to Honeywell International Inc. U.S. Pat. No. 6,097,183 is incorporated herein by reference in its entirety and generally teaches a position determining apparatus that does not require a relatively long magnet and/or small sensor spacing. This is preferably achieved by providing a correction mechanism to correct for residual error cause by the non-linearity of the sensors. The correction mechanism preferably approximates the residual error with a predetermined function, and applies selected correction factors that correspond to the predetermined function to offset the residual error.

As indicated in U.S. Pat. No. 6,097,183, a magnet can be attached to a movable member, which moves along a predefined path of finite length. An array of magnetic field transducers can be located adjacent to the predefined path. The transducers provide a bipolar output signal as the magnet approaches, passes and moves away from each transducer. To determine the position of the magnet, and thus the movable member, the transducers can be electronically scanned and data selected from a group of transducers having an output that indicates relative proximity to the magnet.

A ratio can then be calculated by dividing the amplitudes of the output signal values of the selected transducers in a predetermined way. The position of the magnet is then determined by applying a correction factor to the ratio. Preferably, the correction factor at least partially corrects for the non-linearity of the transducers.

To calculate the ratio, two adjacent transducers are preferably selected with the first transducer having a positive output signal value "A", and the second transducer having a negative output signal value "B" (though these can be reversed). By using the output signal values A and B, a ratio may be calculated that is related to the position of the magnet relative to the first and second transducers, as described above.

An additional example of an MR array algorithm and/or method that can be utilized to process bridge output signals is disclosed in U.S. Pat. No. 6,806,702, "Magnetic Angular Position Sensor Apparatus," which issued to Lamb et al on Oct. 19, 2004. and is also assigned to Honeywell International Inc. U.S. Pat. No. 6,806,702 is incorporated herein by reference in its entirety and generally teaches an angular position sensing apparatus and method that involves the use of a rotatable base and two or more magnets located proximate to one another upon the rotatable base. The magnets are generally magnetized parallel and opposite to one another to create a uniform magnetic field thereof. A sensor is located external to the two magnets, such that the sensor comes into contact with the uniform magnetic field to sense a change in angular position associated with the rotatable base.

The sensor can be mounted on a printed circuit board (PCB), which is also located external to the magnets. Such a sensor can be configured as, for example, a Hall sensor or a magnetoresistive sensor. If the sensor is configured as a magnetoresistive sensor, such a magnetoresistive sensor can also include a plurality of magnetoresistors arranged within a magnetoresistive bridge circuit. Alternatively, the magnetoresistive sensor can include two magnetoresistive bridge circuits integrated with one another in a Wheatstone bridge configuration, wherein each of the magnetoresistive bridge circuits comprises four magnetoresistors. The sensor described herein can be configured, for example, as an integrated circuit.

Note that the aforementioned methodologies generally disclose techniques for processing bridge output signals in order to determine position data thereof. Such techniques can be implemented in the context of a module or a group of modules, depending upon design considerations. In the computer programming arts, a "module" can be typically implemented as a collection of routines and data structures that performs particular tasks or implements a particular abstract data type. Modules generally are composed of two parts. First, a software module may list the constants, data types, variable, routines and the like that that can be accessed by other modules or routines. Second, a software module can be configured as an implementation, which can be private (i.e., accessible perhaps only to the module), and that contains the source code that actually implements the routines or subroutines upon which the module is based. Thus, for example, the term module, as utilized herein generally refers to software modules or implementations thereof. Such modules can be utilized separately or together to form a program product that can be implemented through signal-bearing media, including transmission media and recordable media.

Thus, for example, a processing module for processing a plurality of bridge output signals in order to determine position data thereof can be provided in association with a die comprising a central location thereof, wherein a plurality of magnetoresistive bridge circuits are located and/or configured upon the die. Such a module can also be provided in association with a magnetic biasing component for biasing the plurality of magnetoresistive bridge circuits with a magnetic field rotating about an axis of the central location of the die in order to generate a plurality of bridge output signals thereof, wherein the plurality of magnetoresistive bridge circuits are biased utilizing a magnetic biasing component. Such components, together with the processing module can be said to form a "system".

Such a processing module can determine position data by calculating a ratio of the plurality of bridge output signals of selected magnetoresistive bridge circuits among the plurality of magnetoresistive bridge circuits applying a selected correction factor to the ratio to determine the position data. The selected correction factor can be selected from a number of correction factors. The number of correction factors may collectively fall along a predetermined function comprising, for example, a sinusoidal function. Alternatively, the processing module may fit the plurality of bridge output signals to one or more curves and utilize a crossover point of the curve(s) to determine the position data.

Such a processing module can also be configured to determine a characteristic curve for at least one magnetoresistive bridge circuit among the plurality of magnetoresistive bridge circuits as the magnetic biasing component approaches, passes and moves away from the magnetoresistive bridge circuit(s), and thereafter fit the plurality of bridge output signals to the characteristic curve to determine the position data.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A magnetic sensing method, comprising:
   providing a die comprising a central location thereof;
   locating a plurality of magnetoresistive bridge circuits upon said die, wherein said plurality of magnetoresistive bridge circuits comprises a rotary AMR array configuration;
   biasing said plurality of magnetoresistive bridge circuits with a magnetic field rotating about an axis of said central location of said die in order to generate a plurality of bridge output signals thereof, wherein said plurality of magnetoresistive bridge circuits are biased utilizing a magnetic biasing component; and processing said plurality of bridge output signals in order to determine position data thereof by calculating a ratio of said plurality of bridge output signals of selected magnetoresistive bridge circuits among said plurality of magnetoresistive bridge circuits.

2. The method of claim 1 wherein processing said plurality of bridge output signals in order to determine position data thereof, further comprises:
amplifying said plurality of bridge output signals; and
applying a selected correction factor to said ratio to determine said position data.

3. The method of claim 2 further comprising selecting said selected correction factor from a number of correction factors.

4. The method of claim 3 wherein said number of correction factors collectively fall along a predetermined function.

5. The method of claim 4 wherein said predetermined function comprises a sinusoidal function.

6. The method of claim 1 wherein processing said plurality of bridge output signals in order to determine position data thereof, further comprises:
fitting said plurality of bridge output signals to at least one curve; and using a crossover point of said at least one curve to determine said position data.

7. The method of claim 1 wherein processing said plurality of bridge output signals in order to determine position data thereof, further comprises:
determining a characteristic curve for at least one magnetoresistive bridge circuit among said plurality of magnetoresistive bridge circuits as said magnetic biasing component approaches, passes and moves away from said at least one magnetoresistive bridge circuit; and
fitting said plurality of bridge output signals to said characteristic curve to determine said position data.

8. A magnetic sensing method, comprising:
providing a die comprising a central location thereof;
locating a plurality of magnetoresistive bridge circuits upon said die, wherein said plurality of magnetoresistive bridge circuits comprises a four bridge 45° rotary AMR array configuration;
biasing said plurality of magnetoresistive bridge circuits with a magnetic field rotating about an axis of said central location of said die in order to generate a plurality of bridge output signals thereof, wherein said plurality of magnetoresistive bridge circuits are biased utilizing a magnetic biasing component; and
processing said plurality of bridge output signals in order to determine position data thereof by calculating ratio of said plurality of bridge output signals of selected magnetoresistive bridge circuits among said plurality of magnetoresistive bridge circuits.

9. The method of claim 8 wherein said magnetic biasing component is rotated about said axis at a rotation angle that is selected from at least one angle of an angular range between 0° and 180°, wherein said magnetic biasing component biases said plurality of magnetoresistive bridge circuits with said magnetic field rotating about said axis of said central location of said die in order to generate said plurality of bridge output signals thereof.

10. The method of claim 8 wherein each of said plurality of magnetoresistive bridge circuits comprises at least one transducer.

11. A magnetic sensing system, comprising:
a die comprising a central location thereof;
a plurality of magnetoresistive bridge circuits located upon said die, wherein said plurality of magnetoresistive bridge circuits comprises a four bridge 45° rotary AMR array configuration;
a magnetic biasing component for biasing said plurality of magnetoresistive bridge circuits with a magnetic field rotating about an axis of said central location of said die in order to generate a plurality of bridge output signals thereof; and
a module for processing said plurality of bridge output signals in order to determine position data thereof wherein said module determines said position data by calculating a ratio of said plurality of bridge output signals of selected magnetoresistive bridge circuits among said plurality of magnetoresistive bridge circuits.

12. The system of claim 11 wherein said module:
amplifies said plurality of bridge output signals, and
applies a selected correction factor to the ratio to determine said position data.

13. The system of claim 12 further comprising selecting said selected correction factor from a number of correction factors.

14. The system of claim 13 wherein said number of correction factors collectively fall along a predetermined function.

15. The system of claim 14 wherein said predetermined function comprises a sinusoidal function.

16. The system of claim 11 wherein said module:
fits said plurality of bridge output signals to at least one curve;
and utilizes a crossover point of said at least one curve to determine said position data.

17. The system of claim 11 wherein said module:
determines a characteristic curve for at least one magnetoresistive bridge circuit among said plurality of magnetoresistive bridge circuits as said magnetic biasing component approaches, passes and moves away from said at least one magnetoresistive bridge circuit; and
fits said plurality of bridge output signals to said characteristic curve to determine said position data.

18. The system of claim 11 wherein said magnetic biasing component is rotated about said axis at a rotation angle that is selected from at least one angle of an angular range between 0° and 180°, wherein said magnetic biasing component biases said plurality of magnetoresistive bridge circuits with said magnetic field rotating about said axis of said central location of said die in order to generate said plurality of bridge output signals thereof.

19. The system of claim 11 wherein each of said plurality of magnetoresistive bridge circuits comprises at least one transducer.

* * * * *